(12) United States Patent
Smith et al.

(10) Patent No.: US 6,961,263 B2
(45) Date of Patent: Nov. 1, 2005

(54) MEMORY DEVICE WITH A THERMALLY ASSISTED WRITE

(75) Inventors: Kenneth K. Smith, Boise, ID (US); Thomas C. Anthony, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 17 days.

(21) Appl. No.: 10/657,519

(22) Filed: Sep. 8, 2003

(65) Prior Publication Data

US 2005/0052902 A1 Mar. 10, 2005

(51) Int. Cl.[7] ............... G11C 11/14; G11C 11/15; G11C 5/06
(52) U.S. Cl. ............ 365/158; 365/171; 365/173; 365/66
(58) Field of Search ............... 365/158, 171, 365/173, 63, 66

(56) References Cited

U.S. PATENT DOCUMENTS

| | | | |
|---|---|---|---|
| 6,169,686 B1 | 1/2001 | Brug et al. | |
| 6,205,051 B1 | 3/2001 | Brug et al. | |
| 6,205,053 B1 | 3/2001 | Anthony | |
| 6,358,757 B2 | 3/2002 | Anthony | |
| 6,385,082 B1 * | 5/2002 | Abraham et al. | 365/173 |
| 6,424,565 B2 | 7/2002 | Brug et al. | |
| 6,504,742 B1 | 1/2003 | Tran et al. | |
| 6,511,855 B2 | 1/2003 | Anthony | |
| 6,542,402 B2 * | 4/2003 | Hidaka | 365/171 |
| 6,567,301 B2 | 5/2003 | Anthony et al. | |
| 6,577,529 B1 | 6/2003 | Sharma et al. | |
| 6,704,220 B2 * | 3/2004 | Leuschner | 365/173 |
| 6,724,674 B2 * | 4/2004 | Abraham et al. | 365/211 |
| 6,744,651 B2 * | 6/2004 | Tang | 365/33 |
| 2002/0089874 A1 * | 7/2002 | Nickel et al. | 365/171 |
| 2003/0235072 A1 * | 12/2003 | Kim et al. | 365/158 |

* cited by examiner

*Primary Examiner*—Anh Phung
*Assistant Examiner*—J. H. Hur

(57) ABSTRACT

A memory device includes an array of magnetic storage cells. Each magnetic storage cell in the array includes a set of conductors used to write data to a storage cell and a second set of conductors used to heat the magnetic storage cell and read data from the magnetic storage cell. The magnetic storage cells can be used in electronic systems such as a computer system or consumer electronic system.

26 Claims, 3 Drawing Sheets

MEMORY DEVICE WITH A THERMALLY ASSISTED WRITE

BACKGROUND

1. Field of the Invention

The present invention pertains to the field of solid-state memories. More particularly, this invention relates to a solid-state random access memory with magnetic storage cells.

2. Art Background

Solid-state memories have a wide variety of applications including, but not limited, to computer systems and consumer electronics such as personal computers, hand-held computers, file servers, radios, personal digital assistants, telephones, and video games.

Solid-state memories are usually constructed of semiconductor material. For example, solid-state memories include dynamic random access memories (DRAMs) as well as persistent or non-volatile memories such as flash memory, to name a few. A solid-state memory is typically arranged as one or more arrays of memory cells or storage cells. The structure of each storage cell typically provides a mechanism for storing a bit of information. For example, the storage cells in a typical DRAM include structures that form a capacitor for storing an electrical charge to represent information such as a data bit. In addition, the storage cells in a typical flash memory include structures that form a floating gate for persistent storage of an electrical charge.

A solid-state magnetic memory can also be constructed of magnetic materials. In a magnetic random access memory (MRAM), a bit of information is stored in the magnetic state of a patterned magnetic thin film. Typically, an MRAM contains of an array of magnetic memory cells positioned at the points of intersection of a cross-point array of conductors. The conductors are used to write information into the MRAM by application of current to selected row and column conductors. This current subjects all bits along the selected row and column to magnetic field. Inadvertent writing of unselected bits on the selected row and column conductors creates "half-select" writing errors. The same row and column conductors can be used to read information from the MRAM by measuring the resistance of selected memory cells. Sharing conductors for reading and writing functions makes it difficult to simultaneously read and write data within an MRAM array.

An MRAM design is desired that mitigates or eliminates half-select writing and enables simultaneous read and write functions.

BRIEF DESCRIPTION OF THE DRAWINGS

The present invention is described with respect to a particular exemplary embodiments thereof and references accordingly made to the drawings in which.

Further scope of applicability of the present invention will become apparent from the detailed description given hereinafter. However, it should be understood that the detailed description and specific examples, while indicating preferred embodiments of the invention are given by way of illustration only, since various changes and modifications within the spirit and scope of the invention will become apparent to those skilled in the art from this detailed description.

DETAILED DESCRIPTION

Figure 1:
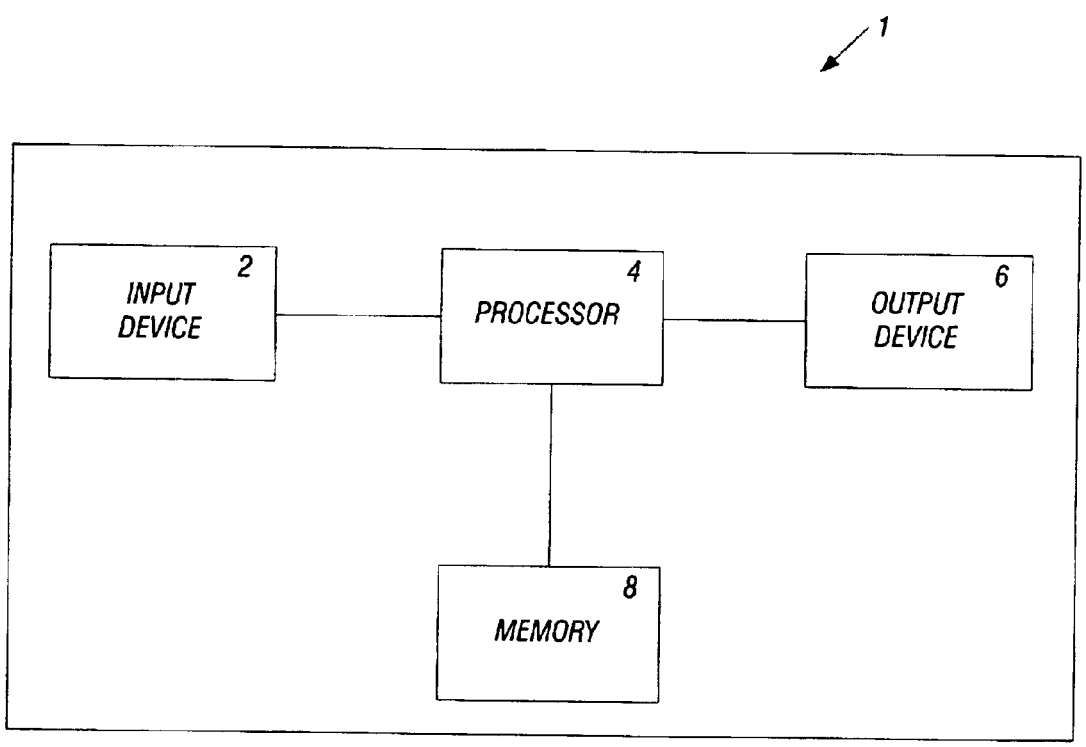
FIG. 1 is the architecture of an electronic system in accordance with embodiments of the present invention.

FIG. 1 illustrates the architecture of an example electronic system 1 that may use a solid-state memory device 8 according to an embodiment of the invention. The electronic system includes an input device 2 which may be a keyboard, keypad, infrared sensor, input port or the like. The input device is coupled to a processor 4 which is coupled to an output device 6 and the memory device 8. In a computer system, the input device may be a keyboard and the output device may be a display. The processor is able to execute various types of software applications, such as a word processing program where a person would type into the input device and have the words displayed on the output device. Similarly, a video game may have a processor executing a game program that is stored in memory.

Figure 2A:
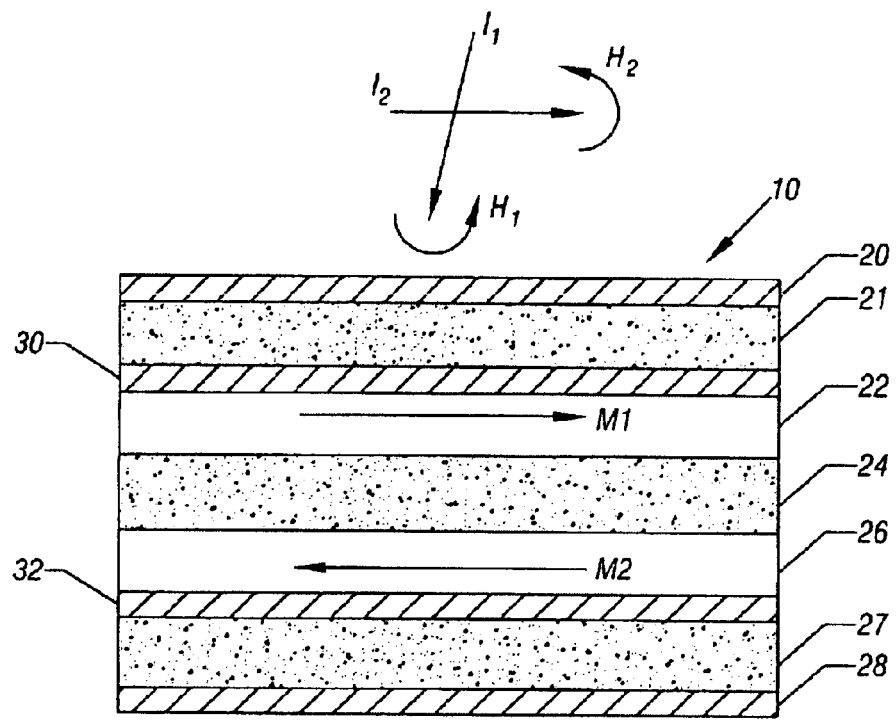
FIGS. 2A & 2B illustrate the storage of a data bit in a magnetic storage cell in accordance with embodiments of the present invention.
Figure 2B:
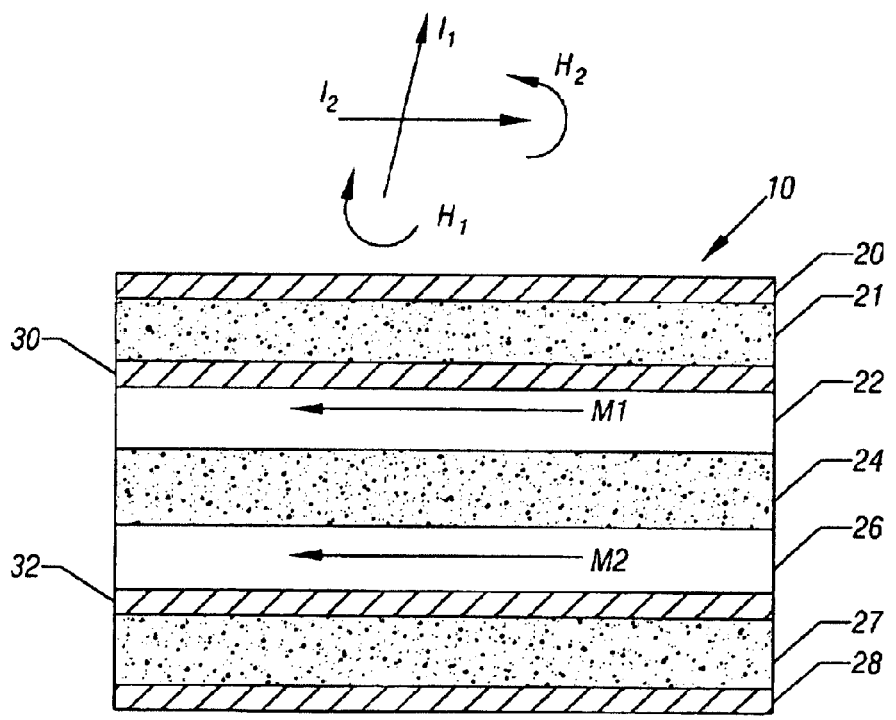

FIG. 2A and FIG. 2B illustrate the storage of a data bit in a magnetic storage cell 10 in accordance with an embodiment of the invention. The magnetic storage cell 10 may include a magnetic film 22 and a magnetic film 26, which are separated by a dielectric region 24. In FIG. 2A and FIG. 2B, the orientation of magnetization in the magnetic film 22 is shown as M1 and the orientation of the magnetization in the magnetic film 26 is shown as M2.

One of the magnetic films 22 and 26 has a fixed orientation of magnetization (reference layer) while the other has a non-fixed orientation of magnetization (data layer). The one of the magnetic films 22 and 26 having a non-fixed orientation of magnetization is the active magnetic film of the magnetic storage cell 10. The data layer rotates its orientation of magnetization in response to electrical signals applied to the conductor set 20 and 28 during write operations to the magnetic storage cell 10. Current can be driven on conductor 20 in a first direction and 28 in a second direction to orient the magnetization of the data layer 22 in this illustration. In this example, the current $I_1$ in conductor 20 may be flowing perpendicular to the page from the back side to the front side of the page, generating field $H_1$. The current $I_2$ in conductor 28 may be flowing from left to right, producing a magnetic field $H_2$ perpendicular to the page in the vicinity of magnetic films 22 and 26. The combination of $H_1$ and $H_2$ magnetic fields acting on the data layer is sufficient to set its magnetic orientation, whereas exposure to either $H_1$ or $H_2$ fields alone should not alter the magnetic orientation of the data layer. The magnetic orientation is depicted as a left to right arrow M1 in FIG. 2A. To reverse the orientation of the magnetization on magnetic film 22, the current on conductor 20) would be driven in the opposite direction, producing field $H_1$, as shown in FIG. 2B. The reversed orientation is depicted as a right to left arrow M1 in FIG. 2B. In one embodiment, a first logic state of the data bit stored in the magnetic storage cell 10 is indicated when M1 and M2 are parallel, such as in FIG. 2B, and a second logic state is indicated when M1 and M2 are anti-parallel, such as in FIG. 2A.

In another embodiment, both the reference layer and the data layer can have a non-fixed orientation of magnetization. In this case, the reference layer is referred to as a "soft reference layer", and has its orientation set in a predetermined direction through exposure to a magnetic field either prior to or during the read operation. The strength of the magnetic field used to orient the soft reference layer is insufficient to re-orient the magnetization of the data layer. Electrical isolation of read conductors 30 and 32 from write conductors 20 and 28 enables application of magnetic field to the magnetic storage cell 10 while reading the memory state.

While the magnetic storage cell 10 depicted in FIGS. 2A and 2B has the data layer above the reference layer, the reverse configuration is also possible.

FIG. 2A illustrates a "zero" logic state, for example, of a bit stored in the magnetic storage cell 10. In the "zero" logic state, the orientation of the magnetization in the magnetic film 22 is, in this example, anti-parallel to the orientation of the magnetization M2 in the magnetic film 26. FIG. 1B shows a "one" logic state of the magnetic storage cell 10, in this example. In the "one" logic state, M1 is parallel to M2. It is understood by persons skilled in the art that the "zero" and "one" logic states are arbitrary and could be reversed.

The magnetic storage cell 10 is read by applying a voltage potential, which may be referred to as a read voltage, across the conductor set 30 and 32. The read voltage causes an electrical current, which may be known as a sense current, to flow between the magnetic films 22 and 26 as electrical charge migrates through the dielectric region 24 according to a phenomena which may be known in the art as spin tunneling. The storage cell 10 may be referred to as a spin tunneling storage cell. Conductor set 30 and 32 are isolated from conductor set 20 and 28 by the insulating layers 21 and 27.

The resistance of the magnetic storage cell 10 differs according to the orientations of M1 and M2. When M1 and M2 are anti-parallel, the zero logic state, the resistance of the magnetic storage cell 10 is at its highest. On the other hand, the resistance of the magnetic storage cell 10 is at its lowest when M1 and M2 are parallel which corresponds to the one logic state. As a consequence, the logic state of the data bit stored in the magnetic storage cell 10 can be determined by measuring its resistance. The resistance of the magnetic storage cell 10 is reflected by the magnitude of the sense current that flows on conductor set 30 and 32 in response to the read voltage applied to conductor set 30 and 32.

During a write operation, a biasing voltage can be applied across conductor set 30 and 32 to produce a current that will flow through magnetic film 22 and 26 and the dielectric region 24. This current will cause the magnetic film 22 to rise in temperature due to Joule heating. The rise in temperature will reduce the coercivity of the device, and thus lower write currents are required to write data to the bit cell. Therefore, smaller write current transistors are used which may increase memory efficiency and may allow for denser memories to be designed. Higher density memories cost less to manufacture. In addition, reducing the coercivity of the bit selected for writing reduces the probability of inadvertent writing of other bits on the selected row and column conductors. Bits that see only one of the two fields associated with the row and column write currents are referred to as "half-selected" bits. Mitigation or elimination of half-select writing is highly advantageous to memory functionality.

Note that the same conductors 30 and 32 are used to heat the storage cell as to read the storage cell, and that these conductors are different from the conductors 20 and 28 used to apply magnetic field to write the storage cell. Electrical isolation of read (heat) and write conductors enables simultaneous activation of circuits associated with these two conductor sets. Consequently, memory cells can be conveniently heated by passing current through the read (heat) conductors while at the same time magnetic field is applied to the heated cell during a write operation. In addition, electrical isolation of read and write conductors permits magnetic field to be applied to a memory cell during a read operation. Subjecting a bit to a variable magnetic field during the read cycle enables dynamic readout. Dynamic readout is a self-referencing method that can yield higher speed reading by comparing the measured resistance of the bit at two or more known magnetic field conditions.

The temperature of the selected bit can be elevated by means other than by Joule heating due to current flowing across dielectric region 24. In a second example, a heater element can be placed in series with, and adjacent to, the bit cell such that current flowing through the heater element results in a rise in temperature of the heater element and adjacent memory cell. In a third example, a heater element is integrated into one or both of conductors 30 and 32 in a manner such that current flowing through one or both of conductors 30 and 32 results in Joule heating of conductors 30 and 32. Since conductors 30 and 32 are adjacent to the memory cell (layers 22, 24, 26), the temperature of the memory cell also rises. In all three examples the memory cell can be heated simultaneously with the application of writing currents to conductors 20 and 28.

While the foregoing memory cell embodiments most closely describes a tunnel junction storage cell, alternate embodiments may include any magnetoresistive storage cell such as a giant magnetoresistance structure (GMR) or a standard anisotropic magnetoresistive material (AMR) without departing from the spirit of the invention.

Figure 3:
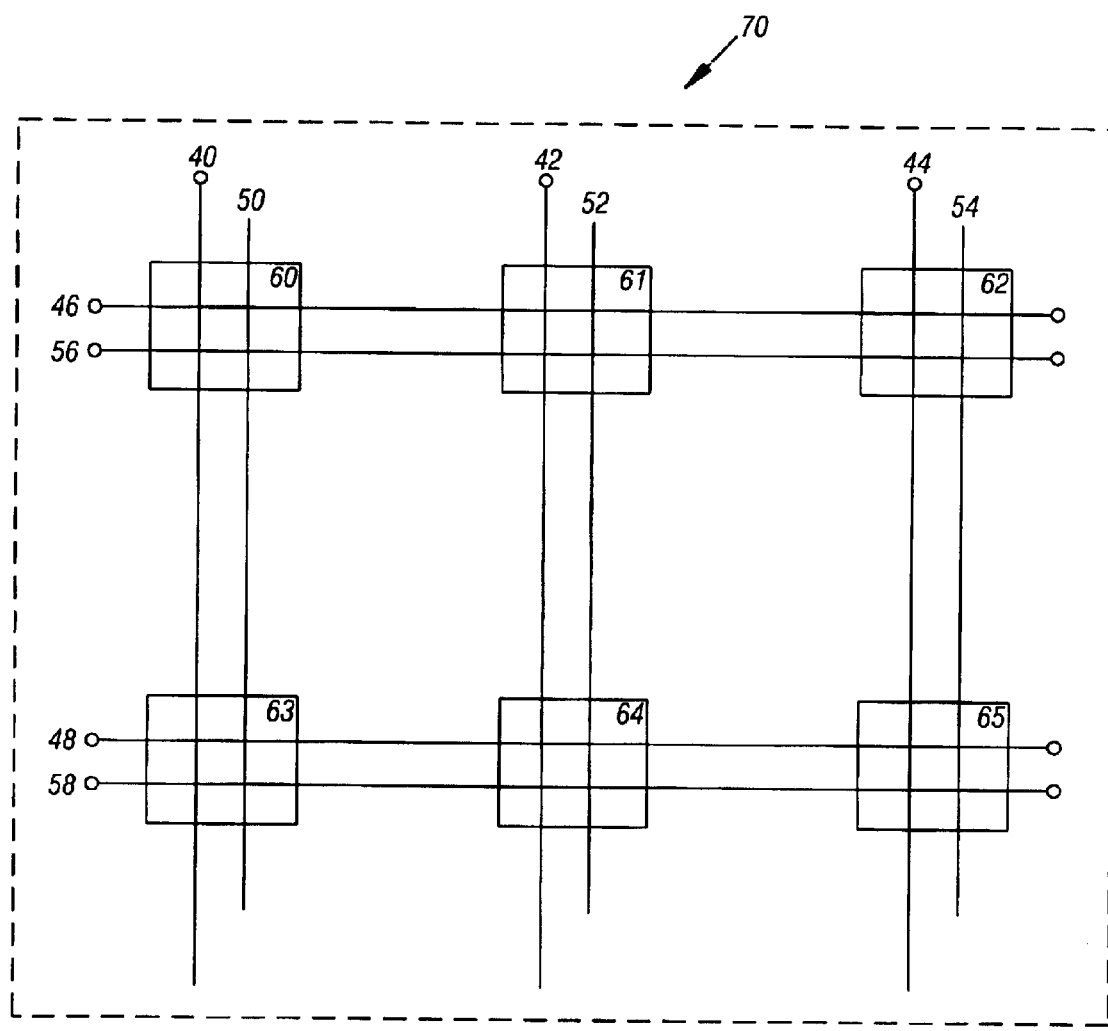
FIG. 3 is a top view of an array of magnetic random access memory in accordance with embodiments of the present invention.

FIG. 3 is a schematic diagram of a solid-state memory 70 which includes an array of magnetic storage cells 60–65. The solid-state memory 70 also includes an array of conductors 40–58 that enable read and write access to the magnetic storage cells 60–65. The magnetic storage cells 60–65 use magnetization to store information as described above. Each of the magnetic storage cells 60–65 enables storage of a corresponding bit of information which may be referred to as a data bit. The magnetic storage cells 60–65 and the conductors 40–58 are formed on a semiconductor substrate. In this embodiment, conductors 40–44 and conductors 50–52 are arranged on top of the magnetic storage cell. In this embodiment, conductors 46, 56, 48 and 58 are formed beneath the magnetic storage cell. It will be understood that the top and bottom locations for conductor pairs are arbitrary and that the conductor pairs can be placed anywhere around the magnetic films without departing from the spirit of the invention.

Conductor pairs 40 and 46 represent the conductor pair necessary to heat the magnetic storage cell 60 and are the functional equivalent to lines 30 and 32 in FIGS. 2A and 2B. In operation, a voltage is applied across conductors 40 and 46 thereby heating up magnetic storage cell 60. Once heated, a write current is driven down conductor 50 and optionally another write current is driven down conductor 56 to set the magnetic orientation in magnetic storage cell 60. Conductor pair 50 and 56 are the functional equivalent to lines 20 and 28 in FIGS. 2A and 2B. The magnetic orientation represents the state of the data bit being stored in the magnetic storage cell 60. To change the state of the data bit, the same voltage would be applied across conductor 40 and 46. Then, a similar write current but in the opposite direction would be driven on conductor 50 (and optionally 56) thereby reversing the magnetic orientation and changing the data bit. The current on conductor 56 is not required to change orientation, as is understood by persons skilled in the art.

In an alternative embodiment, conductors 40 and 46 contain heater elements such that current flowing along conductors 40 and 46, rather than through magnetic storage cell 60, leads to a temperature rise of the magnetic storage cell. The resistive element that produces a temperature rise due to Joule heating can be high resistance regions along conductors 40 and 46, or the entire length of the conductor can serve as a heater. In this example, the heating current is flowing through the conductors and not through the bit cell.

The magnetic storage cells 61–65 operate in a similar manner as magnetic storage cell 60. The description of magnetic storage cell 60 is illustrative of magnetic cells 61–65. Furthermore, an array of magnetic storage cells is not limited to six storage cells but rather may include thousands or millions or more of storage cells. Each of the magnetic storage cells may be accessed randomly and therefore the array magnetic storage cells are also referred to as random access memory or more specifically magnetic random access memory. FIG. 3 describes an array of magnetic storage cells and conductors in which both read conductors 40–48 and write conductors 50–58 form cross-point arrays. Other conductor arrangements are possible within the scope of this invention. For example, read conductors 40–48 do not have to be configured in a cross-point array. Instead, read conductors could be oriented in a common direction, with magnetic memory cells connected to the conductors either in series or in parallel. The same advantages of reduced half-select susceptibility, improved area efficiency and read-while-write capability can be obtained in alternative arrangements of the read and write conductor sets.

The foregoing detailed description of the present invention is provided for the purposes of illustration and is not intended to be exhausted or to limit the invention to the precise embodiments disclosed. Accordingly, the scope of the present invention is defined by the appended claims.

What is claimed is:

1. A memory device, comprising:
    an array of magnetic storage cells, each cell comprising a first magnetic layer, a second magnetic layer, and a dielectric in between each said first and second magnetic layers;
    a first set of conductors to receive current for writing data to said magnetic storage cells; and
    a second set of conductors to provide a voltage across the second set of conductors to cause current flow through at least one of the magnetic storage cells for heating said at least one magnetic storage cell while writing a bit of data to said at least one magnetic storage cell.

2. The memory device of claim 1, wherein the first set of conductors is electrically isolated from the second set of conductors within the array of magnetic storage cells.

3. The memory device of claim 1, wherein heating said at least one magnetic storage cell reduces the magnetic coercivity of at least one of the first and second magnetic layers of the magnetic storage cell.

4. The memory device of claim 1, wherein the array of magnetic storage cells comprise spin tunneling storage cells.

5. The memory device of claim 1, wherein the array of magnetic storage cells comprise giant magnetoresistive storage cells.

6. The memory device of claim 1, wherein said array of magnetic storage cells comprise anisotropic magnetoresistive material.

7. The memory device of claim 1, wherein said array of magnetic storage cells comprise any magnetoresistive storage material.

8. The memory device of claim 1 wherein said magnetic storage cells serve as electrical heating elements.

9. The memory device of claim 1, wherein said second conductor set includes a heater element placed in series with at least one of the conductors of the second conductor set.

10. The memory device of claim 9, wherein said heater element is a resistive device.

11. The memory device of claim 1, wherein the first set of conductors is separate from the second set of conductors.

12. The memory device of claim 1, wherein the first and second magnetic layers and the dielectric of the at least one magnetic storage cell and the first and second set of conductors are arranged in a stack,
    wherein the second set of conductors is located between the first set of conductors in the stack.

13. The memory device of claim 12, the second set of conductors to further provide a read voltage across the second set of conductors to read the at least one magnetic storage cell during a read operation.

14. The memory device of claim 1, the second set of conductors to further provide a read voltage across the second set of conductors to read the at least one magnetic storage cell during a read operation.

15. A memory device, comprising:
    an array of magnetic storage cells, each cell comprising a first magnetic layer, a second magnetic layer, and a dielectric in between each said first and second magnetic layers;
    a first set of conductors to receive current for writing data to said magnetic storage cells;
    a second set of conductors for heating at least one magnetic storage cell while writing a bit of data to said at least one magnetic storage cell; and
    a heater element placed in series with the at least one magnetic storage cell.

16. An electronic device comprising:
    a processor;
    an input device coupled to said processor;
    an output device coupled to said processor;
    and a memory device coupled to said processor, wherein said memory device comprises:
        an array of magnetic storage cells, each magnetic storage cell comprising a first magnetic layer, a second magnetic layer, and a dielectric in between each said first and second magnetic layers;
        a first set of conductors to receive current for writing data to said magnetic storage cells; and
        a second set of conductors for applying a voltage across at least one magnetic storage cell for heating said at least one magnetic storage cell while writing a bit of data to said at least one magnetic storage cell.

17. The electronic device of claim 16, wherein the array of magnetic storage cells comprise random access memory.

18. The electronic device of claim 16, wherein said first magnetic layer has a fixed orientation of magnetization and the second layer has a non-fixed orientation.

19. The electronic device of claim 16, wherein at least one of said second set of conductors includes a resistive heating element for heating each magnetic storage cell when current flows through said heating element.

20. The electronic device of claim 16, wherein the first set of conductors is separate from the second set of conductors.

21. The electronic device of claim 16, wherein the first and second magnetic layers and the dielectric of the at least one magnetic storage cell and the first and second set of conductors are arranged in a stack, wherein the second set of conductors is located between the first set of conductors in the stack.

22. The electronic device of claim 21, the second set of conductors to further provide a read voltage across the second set of conductors to read the at least one magnetic storage cell during a read operation.

23. The electronic device of claim 16, the second set of conductors to further provide a read voltage across the second set of conductors to read the at least one magnetic storage cell during a read operation.

24. A magnetic storage cell comprising:
- a first magnetic layer, a second magnetic layer, and a dielectric in between said first and second magnetic layers;
- a first set of conductors positioned above and below said first and second magnetic layers for writing to said magnetic storage cell; and
- a second set of conductors positioned above and below said first and second magnetic layers for applying a voltage across said magnetic storage cell for heating said magnetic storage cell while writing a bit of data to said magnetic storage cell and for reading the data bit that is stored on said magnetic storage cell.

25. The magnetic storage cell of claim 24, wherein said magnetic storage cell is a spin tunneling storage cell.

26. The magnetic storage cell of claim 24, wherein the first and second magnetic layers, dielectric, first set of conductors, and second set of conductors are arranged in a stack, and
wherein the second set of conductors is located between the first set of conductors in the stack.

* * * * *